United States Patent [19]

Schedele et al.

[11] 4,176,241
[45] Nov. 27, 1979

[54] FLUID-TIGHT PROTECTIVE SYSTEM FOR AN ELECTROMECHANICAL COMPONENT

[75] Inventors: Helmut Schedele, Hoegling; Romuald von Tomkewitsch, Ebenhausen, both of Fed. Rep. of Germany

[73] Assignee: Siemens Aktiengesellschaft, Berlin & Munich, Fed. Rep. of Germany

[21] Appl. No.: 783,838

[22] Filed: Apr. 1, 1977

[30] Foreign Application Priority Data

Apr. 13, 1976 [DE] Fed. Rep. of Germany ....... 2616299

[51] Int. Cl.² .............................................. H05K 5/06
[52] U.S. Cl. .................................. 174/52 S; 228/214; 335/202
[58] Field of Search ............. 174/52 S, 52 FP, 52 PE, 174/76; 335/202, 260, 278, 294; 228/180 R, 214; 357/72, 74

[56] References Cited

U.S. PATENT DOCUMENTS 2,389,592  11/1945  Bucklen et al. .................. 335/202 X
3,340,438   9/1967  Dion et al. ................... 174/52 FP X

FOREIGN PATENT DOCUMENTS 62558  7/1944  Denmark ................................. 174/52 S

OTHER PUBLICATIONS

Amaro et al., IBM Technical Disclosure Bulletin, vol. 18, No. 3, Aug. 1975, pp. 751, 752.

*Primary Examiner*—Bruce A. Reynolds
*Assistant Examiner*—D. A. Tone
*Attorney, Agent, or Firm*—Hill, Van Santen, Steadman, Chiara & Simpson

[57] ABSTRACT

A fluid-tight protection system is provided for an electromechanical component in a casing. An insulating absorbent covering layer which has a high capillary absorption capacity is disposed over joints or apertures in the casing requiring sealing. The covering layer is impregnated with a sealing compound which preferably has a thin liquid form during the impregnation. An impermeable film may also be provided to cover the absorbent covering layer.

14 Claims, 10 Drawing Figures

FLUID-TIGHT PROTECTIVE SYSTEM FOR AN ELECTROMECHANICAL COMPONENT

BACKGROUND OF THE INVENTION

The invention relates to a fluid-tight protective system for an electromechanical component, for example a relay, in which an insulating covering is disposed over casing joints or apertures to be sealed, and to methods of sealing such a component.

Where electrical components are used on circuit boards, modern soldering techniques require that not only the circuit boards themselves but also the individual components are at least partially immersed in soldering and cleaning baths. This involves the risk of liquid and gaseous substances penetrating through holes and apertures into the inside of a component and there contaminating contact surfaces, for example. Components such as relays, for example, which for the most part admittedly have a dust cap but are not fitted with a hermetically sealed casing, would become much more expensive if they had to be made with a hermetically sealed casing just for the soldering process although such a casing would be unnecessary for subsequent operations. Consequently, many attempts have been made to make such components fluid-tight for soldering on circuit boards using simple and inexpensive protective devices and thereby provide at the same time a certain amount of protection against the damaging effects of industrial atmosphere.

In the case of relays, the problem is mainly one of sealing the joints between a base and a protective cap and the apertures provided in the base for the contact connections. Various possibilities have already been suggested such as thermoplastic distortion of the casing parts using ultra sound or a hot die, or again casting the casing in a plastic compound. In many cases these methods provide the desired success but only at considerable expense. Casting components frequently cannot be used because this causes the casting compound itself to flow inside the casing and provoke contamination. In addition, German Published Specification No. 21 29 918 proposed fitting a thermoplastic insulating element in the form of a film or shell over the connecting pins with close-fitting holes. Even this method does not provide adequate sealing in every case as such films frequently are affected by temperature and become distorted and then possibly no longer fit snugly enough around the connecting pins of the component.

SUMMARY OF THE INVENTION

An object of this invention is to provide a protective device in the form of an additional insulating covering such that reliable sealing of the component is guaranteed without high production costs. This is achieved in accordance with the invention in that the covering layer is made of a material with high capillary absorption power and is impregnated with a sealing compound that can be processed as a thin liquid.

The absorbent material used in accordance with the invention, a so-called fleece, spreads the sealing compound very uniformly over the entire surface of the component to be sealed so that a uniformly thin covering layer is produced with the assistance of the adhesive power. This layer only produces a minimal increase in the overall height of the component. In addition, this absorbent material holds the sealing compound securely in the covering layer so that the compound neither contaminates projecting connecting pins nor flows through apertures into the interior of the component in undesirably large quantities, a problem previously feared when using adhesives and similar sealing structures. Preferably the absorbent material is cut exactly to size at the edge of the surface to be sealed so that even peripheral apertures, for example between a base and a protective cap in a relay, are reliably sealed through adhesion of the layer to the surface of the component together with the capillary action.

With irregular fleeces, the sealing compound spreads uniformly on a concentric basis, but with longitudinally orientated fleeces it spreads more rapidly in the favored direction. To ensure that the covering layer is completely impregnated in the shortest possible time, it is advantageous to seal elongated components with longitudinally orientated fleeces. The absorbent covering layer can be provided with holes beforehand to accommodate projecting parts of the component before it is fitted on the component. In many applications, however, it may also be advantageous from a production viewpoint not to provide the covering layer with holes beforehand but to perforate it with the projecting connecting pins of the component when fitting the two together. Differences in level or parts lying on the surface of the component can also be sealed off with the absorbent covering layer. Preferably the thickness of the layer will then be greater than the differences in level in the surface to be sealed. To adapt the covering layer to differences in level in the surface of the component, the layer can be pressed down with a die. Preferably this die has a surface that cannot be wetted by the sealing compound, polytetrafluoroethylene, for instance. The sealing compound absorbed by the covering layer can solidify by cooling or can even be hardened depending upon the application in point.

In one form of the invention, the absorbent covering layer is additionally coated with an impermeable film on the side facing away from the component. Such a film is easy to stamp or provide with lettering and can also be deep-drawn to accommodate fairly large differences in level in the surface of the component, for example. Naturally this impermeable film ensures better sealing because its adhesive forces can also be utilized. In this way, fairly large apertures can be sealed using relatively thin fleeces. In addition, it is also possible to reduce large apertures first with an impermeable film or even cover them altogether and then apply the absorbent covering layer in the manner described.

In one useful embodiment of the invention the impermeable film acts as a carrier for the absorbent covering layer which can be applied to the deep-drawn film electrostatically, for example. With suitable measures the absorbent covering layer could also be applied on the component directly by electrostatic means. In both production methods it is expedient to provide a thin coat of adhesive priming to fix the covering layer. When impregnating the absorbent covering layer it is preferable to provide the impermeable film with a filling aperture for the liquid sealing compound. In certain cases it is also advantageous if the component exhibits a depression in the area of the filling aperture. Channels emanating from the depression may also be useful in many sealing operations. Instead of carrying out the impregnation of the covering layer through a filling aperture, the component can also be partially dipped in a thin liquid casting resin compound. In this case the sealing compound is again uniformly spread through the absorbent fleece. When removing the component from the casting resin, it is necessary to insure that the thin liquid casting resin compound is allowed to run off at an angle at one corner of the component.

DESCRIPTION OF THE PREFERRED EMBODIMENTS

Figure 1:
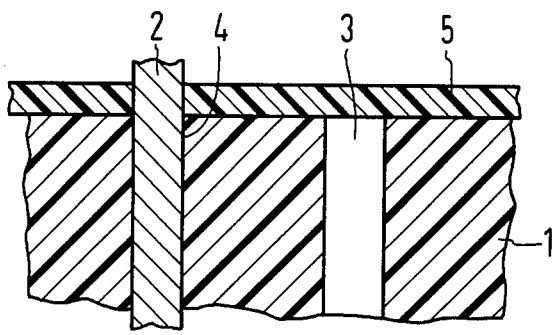
FIG. 1 shows the basic arrangement of an absorbent covering layer of this invention impregnated with casting resin on a component.

FIG. 1 shows an electrical component 1 the surface of which is broken by a projecting pin 2 and an aperture 3. A gap 4 also exists alongside the pin 2. The entire surface of the component is sealed with a covering layer 5 which is made of an absorbent material, a so-called fleece, and impregnated with a thin liquid casting resin compound. This sealing compound is uniformly spread in the covering layer because of the capillary action and held securely at the same time so that it fits snugly around the pin 2 but does not run too far into the apertures 3 or 4. To avoid contamination of the connecting pin 2, for example, the fleece is applied in a dry state and then impregnated using a metering device. However one can use a pre-impregnated material which is also dry when fitted and in which the sealing compound is re-liquified by warming after the fitting operation.

Figure 2:
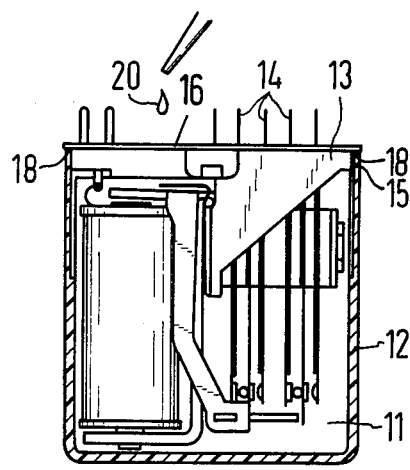
FIGS. 2, 3 and 4 show the protection system of the invention applied to a relay with a protective cap and a base with connecting pins.
Figure 3:
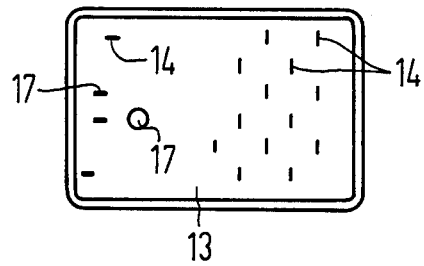
Figure 4:
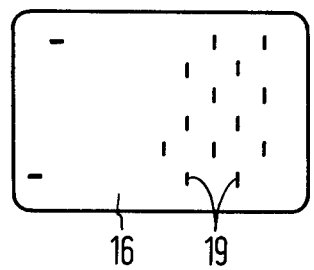
Figure 5:
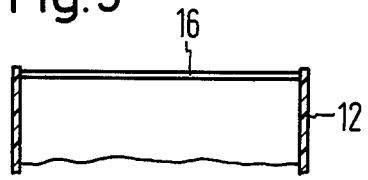
FIG. 5 shows a different embodiment of the protection system of FIG. 2.

FIG. 2 shows the invention applied to an electromagnetic relay 11 with a protective cap 12 and a base 13 in which the connecting pins 14 and the aperture 15 between a base and a protective cap are to be sealed. For this purpose an absorbent fleece 16 is provided which reliably seals not only the connecting pins 14 but also partly unused apertures 17 (see FIG. 3). The fleece is cut as in FIG. 4 so that it can either be laid over the edge 18 of the cap 12 as in FIG. 2 or pressed into the cap 12 as in FIG. 5. At the points corresponding with the contact pins 14 the fleece 16 is provided with slots 19. At a suitable point sufficiently far removed from the connecting pins so that they are not contaminated, a metered quantity of thin liquid adhesive 20 (see FIG. 2) which does not need to be accurately measured is dripped onto the pressed-on fleece. With a fleece thickness of only a few tenths of a millimeter, the height of the relay is only minimally increased by the sealing.

Figure 6:
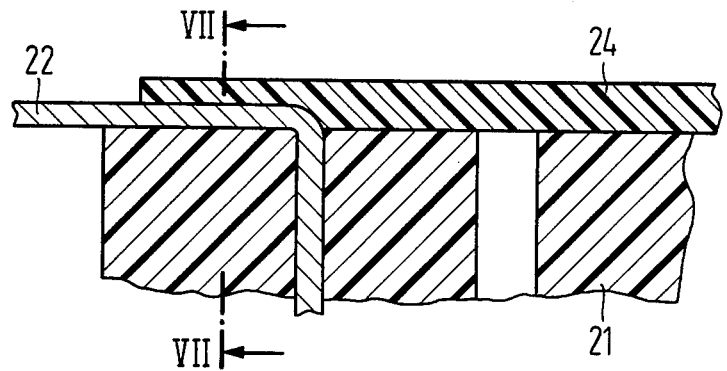
FIGS. 6 and 7 show the invention applied to a component with an uneven surface.
Figure 7:
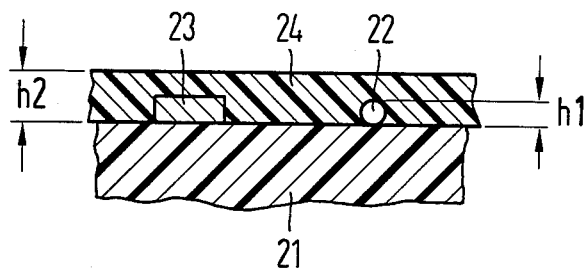

The following figures show further embodiments of the invention. FIGS. 6 and 7 illustrate a component 21, the surface of which exhibits differences in level as a result of components 22 and 23 lying thereon. Here again, sealing with an absorbent covering layer 24 is possible if the impregnated fleece is pressed down with a suitable die which will not stick to the impregnating compound. Similarly with this method, recesses in the faces to be sealed do not have any negative effect on the quality of the seal. However, differences in level h1 in the area to be sealed should not be greater than the thickness h2 of the impregnated fleece 24 (FIG. 7).

Figure 8:
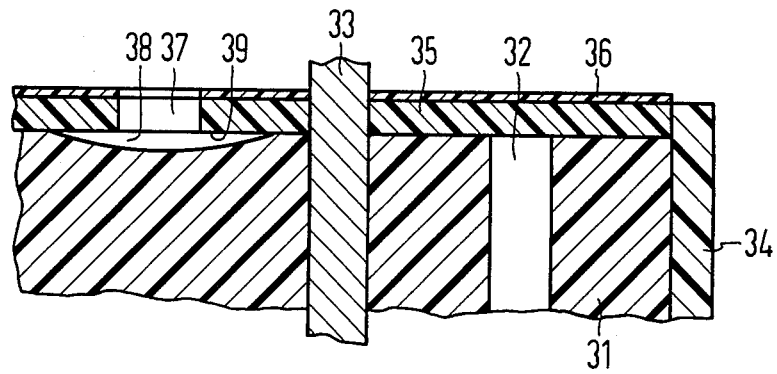
FIG. 8 shows a sealed component with an absorbent covering layer and an impermeable film.

Another embodiment of the invention is shown in FIG. 8 where a component 31 with an aperture 32, a connecting pin 33, and a protective cap 34 is sealed with an impregnatable covering layer 35. This impregnatable fleece 35 is provided with a coating of impermeable film 36 so that when applied with a stamping die, for example, no adhesive sealing compound appears on the surface. A filling aperture 37 is provided for impregnating the fleece. In addition, a filling depression 38 is provided in the component to be sealed in the area of the filling aperture so that the fleece can suck up the sealing compound from its underside 39 over a larger area. Moreover the plastic film 36 can easily be stamped and provided with lettering, which is advantageous for many components.

Figure 9:
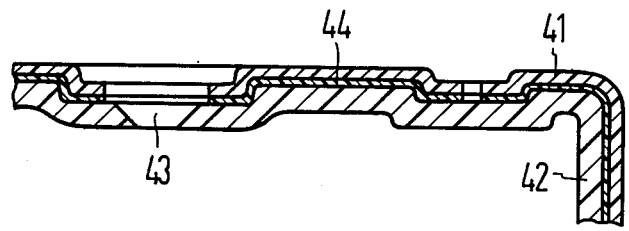
FIG. 9 shows a deep-drawn protective device with a plurality of layers.

FIG. 9 shows a variance from the structure of FIG. 8. Here the plastic film 41 is deep drawn so as to seal even greater differences in level in the surface of the component. The film 41 is coated with an absorbent fleece 42 and has a filling aperture 43 as in FIG. 8. Adhesive priming 44 is provided between the impermeable film and the absorbent fleece for fixing the two together. The coating operation itself can be carried out electrostatically, for example, or with other known methods.

Figure 10:
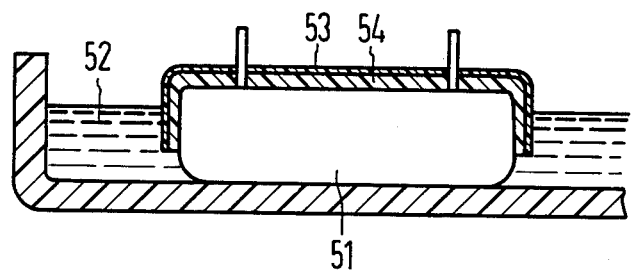
FIG. 10 shows another possible way of impregnating the covering layer in accordance with the invention with a sealing compound.

Instead of impregnating the fleece through a filling aperture as in FIGS. 8 and 9, one can also use other methods. One of these is shown by way of example in FIG. 10. Here a component 51 is dipped in a thin liquid casting resin compound 52 to such an extent that the fleece 54 coated with an impermeable film 53 can absorb the sealing compound 52. Through the capillary action of the fleece 54 the casting resin compound spreads uniformly over the surface of the component and provides a seal after setting. When the component is removed from the liquid sealing compound 52, the thin liquid casting resin compound is drained off over a corner by holding the component at an angle.

As already mentioned, pre-impregnated fleeces can also be used to provide the covering layer in accordance with the invention. These are impregnated with a resin which is still not cross-linked. The resin is only softened again when thermally treated after the covering layer has been applied to the component, and only then does the cross-linking begin. The liquified resin spreads in the desired manner by virtue of the capillary action of the fleece and by virtue of the adhesive action of the surface of the component and seals the component reliably when it sets. Naturally these pre-impregnated covering layers can also be stamped in the manner described beforehand and made to adapt to differences in level in the surface of the component, i.e. pressed down with a stamping die.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A fluid-tight protection system for an electromechanical component in a casing in which an insulating sealing absorbent covering layer is disposed as a seal over substantially all portions of the casing requiring sealing, said sealing covering layer comprising a fleece material means with high capillary absorption capacity which is impregnated with a sealing compound and which distributes the sealing compound evenly by said high capillary absorption capacity, said sealing compound having a thin liquid form when impregnating.

2. A protection system as in claim 1, characterized in that the covering layer has aperture means for receiving projecting portions of the component.

3. A protection system as in claim 1, characterized in that the covering layer has means for adapting to differences in level in the surface of the component requiring sealing.

4. A protection system as in claim 1, characterized in that the sealing compound is hardenable.

5. A protection system as in claim 1, characterized in that the absorbent covering layer is provided as a covering for a surface of the component exposed through an aperture in the casing.

6. A fluid-tight protection system for an electromechanical component in a casing in which an insulating absorbent covering layer is disposed over portions of the casing requiring sealing, said covering layer comprising a material with high capillary absorption capacity which is impregnated with a sealing compound, said sealing compound having a thin liquid form when impregnating, and the absorbent covering layer being covered with an impermeable film on the side facing away from the portions of the casing being sealed.

7. A protection system as in claim 6, characterized in that the impermeable film is provided with a filling aperture means for the sealing compound.

8. A protection system as in claim 7, characterized in that adjacent the filling aperture means a depression, the diameter of which is greater than that of the filling aperture, is provided within the casing.

9. A protection system as in claim 6, characterized in that the impermeable film is deep-drawn to adapt to the surface of the component to be sealed.

10. A protection system as in claim 6, characterized in that the impermeable film is provided with impressions.

11. A fluid-tight protection system for an electromechanical component in a casing in which an insulating absorbent covering layer is disposed over portions of the casing requiring sealing, said covering layer comprising a material with high capillary absorption capacity which is impregnated with a sealing compound, said sealing compound having a thin liquid form when impregnating, and the absorbent covering layer being joined to an impermeable film.

12. A protection system as in claim 11, characterized in that an adhesive priming coat is provided between the absorbent covering layer and the impermeable film.

13. A fluid-tight protection system for an electromechanical component mounted in a casing having an aperture through which said component is inserted into the casing, comprising:
(a) an insulating absorbent layer disposed to cover said aperture of the casing, said layer having apertures cut therein for receiving therethrough contact lugs of the component, said insulating layer having a high capillary absorption capacity;
(b) a sealing means absorbed within said insulating layer; and
(c) an impermeable film covering said insulating layer on a surface of said insulating layer outwardly of said component.

14. A fluid-tight protection system for an electromechanical component in a casing in which an insulating sealing absorbent covering layer is disposed as a seal over substantially all portions of the casing requiring sealing, said sealing covering layer comprising a fleece material means with high capillary absorption capacity which is impregnated with a sealing compound and which distributes the sealing compound evenly by said high capillary absorption capacity, said sealing compound having a thin liquid form when impregnating, and the covering layer being provided with impressions.

* * * * *